(12) United States Patent
Tudhope et al.

(10) Patent No.: US 7,541,069 B2
(45) Date of Patent: Jun. 2, 2009

(54) METHOD AND SYSTEM FOR COATING INTERNAL SURFACES USING REVERSE-FLOW CYCLING

(75) Inventors: Andrew William Tudhope, Danville, CA (US); William John Boardman, Colorado Springs, CO (US); Raul Donate Mercado, Danville, CA (US); Frederick Contreras, Livermore, CA (US)

(73) Assignee: Sub-One Technology, Inc., Pleasanton, CA (US)

( * ) Notice: Subject to any disclaimer, the term of this patent is extended or adjusted under 35 U.S.C. 154(b) by 453 days.

(21) Appl. No.: 11/074,252

(22) Filed: Mar. 7, 2005

(65) Prior Publication Data

US 2006/0198965 A1 Sep. 7, 2006

(51) Int. Cl.
*C23C 16/00* (2006.01)
*H01L 21/441* (2006.01)
(52) U.S. Cl. .................. 427/569; 148/240; 118/715
(58) Field of Classification Search ............... 427/569; 148/240; 118/715
See application file for complete search history.

(56) References Cited

U.S. PATENT DOCUMENTS

| | | | | |
|---|---|---|---|---|
| 4,407,712 A | 10/1983 | Henshaw et al. | ............ | 204/298 |
| 4,714,589 A | 12/1987 | Auwerda et al. | ............... | 427/39 |
| 4,877,642 A | 10/1989 | Gartner et al. | | |
| 5,026,466 A | 6/1991 | Wesemeyer et al. | .... | 204/192.38 |
| 5,587,207 A * | 12/1996 | Gorokhovsky | ............... | 427/571 |
| 6,129,856 A * | 10/2000 | Jung et al. | ..................... | 216/63 |
| 6,182,604 B1 * | 2/2001 | Goeckner et al. | ........ | 118/723 E |
| 7,241,701 B2 | 7/2007 | Dotsikas | ..................... | 427/225 |
| 2006/0196419 A1 * | 9/2006 | Tudhope et al. | ............. | 118/715 |

FOREIGN PATENT DOCUMENTS

| | | |
|---|---|---|
| DE | 3222189 A1 | 1/1984 |
| EP | 0568049 A1 | 4/1993 |
| EP | 1094128 A1 | 10/1999 |
| JP | 63026373 | 2/1988 |
| JP | 63026373 A * | 2/1988 |
| WO | WO 02/075021 A1 | 9/2002 |

OTHER PUBLICATIONS

English abstract of JP63026373 A.*

\* cited by examiner

*Primary Examiner*—Roy King
*Assistant Examiner*—Jie Yang
(74) *Attorney, Agent, or Firm*—Schneck & Schneck; Terry McHugh (57) ABSTRACT

A method and system for coating the internal surfaces of a workpiece is presented. A bias voltage is connected to a workpiece, which functions as a cathode. A gas source and a vacuum source are coupled to each opening through a flow control system. The flow control system is capable of a first mode which enables a first opening to function as a gas inlet and a second opening to function as a vacuum exhaust. The flow control system also has a second mode which enables a first opening to function as a vacuum exhaust and a second opening to function as a gas inlet. The cycling may also be used to coat internal surfaces of a workpiece with a single opening. Cycling the flow control system between the first mode and second mode is performed until a uniform coating along the internal surfaces of the workpiece is achieved.

20 Claims, 5 Drawing Sheets

METHOD AND SYSTEM FOR COATING INTERNAL SURFACES USING REVERSE-FLOW CYCLING

TECHNICAL FIELD

The invention relates generally to chemical vapor deposition systems and more specifically to methods and systems for coating piping.

BACKGROUND ART

Much effort has been expended in improving the corrosion resistance of specialty metal alloys, for example stainless steel (SS), by precisely defining chemistry levels (e.g., 16 to 18% Cr in 316L SS) and decreasing impurity levels (e.g., less than 0.03% S and C in 316L SS) that remain after melting and refining. This requires specialized steel manufacturing methods, such as vacuum oxygen decarburization (VOD), vacuum induction melting (VIM) and vacuum arc remelting (VAR), which add significant cost. An additional problem with low impurity steel is that machinability, hardness and other relevant considerations can be negatively affected. Expensive post machining processing, such as burnishing and electropolishing, often must be performed in order to meet hardness and surface roughness requirements specified by organizations, particularly Semiconductor Equipment and Materials International (SEMI). One solution to these issues is to coat a lower grade base material with a high quality coating material having the desired mechanical, electrical or optical properties (e.g., high hardness, corrosion resistance, wear resistance, or low friction). Typically, these types of properties will be found in metal, ceramic and particularly diamond-like carbon coatings.

Other expensive specialty alloys, such as Hastelloy and Inconel (both of which are federally registered trademarks of Huntington Alloys Corporation), are commonly used for exhaust piping in not only the semiconductor industry, but in chemical processing industries in general. These alloys exhibit high temperature strength and corrosion resistance. Again, a less expensive base material can be used if a suitable surface coating is applied to the interior surface that is to be exposed to the corrosive environment.

Prior art coating methods include chemical vapor deposition (CVD), physical vapor deposition (PVD), plasma spray, electroplating and sol-gel. Of these methods, CVD and PVD provide the highest quality films with regard to purity, adhesion, uniformity and other properties. Both of these techniques require the use of a specialized vacuum chamber, making it difficult to coat fully assembled components. In applications using piping, valves, pumps or tubing for carrying corrosive material, such as the oil/petrochemical industry, the interior surface that is in contact with the corrosive material must be coated. For very low pressure techniques such as PVD, where the pressure is below or near the molecular flow region, coating interior surfaces has been limited to only large diameter and short length (small aspect ratio) tubes. Similarly, CVD techniques are limited to such applications, due to the need to supply heat for the chemical reaction, which can damage heat-sensitive substrates. Plasma enhanced CVD (PECVD) can be used to lower the temperature required for reaction, but there is then difficulty in maintaining uniform plasma inside the pipe and in preventing depletion of source gas as it flows down the pipe.

The plasma immersion ion implantation and deposition (PIIID) technique has been shown to be useful for coating the external surfaces of complex shapes. PIIID is performed by applying a negative bias to the workpiece, which will pull positive ions toward the workpiece, if the plasma sheath is conformal. There are also improvements that can be made to film properties such as adhesion and film density via ion bombardment of the workpiece.

In prior art PVD or CVD chambers, the chamber dimensions are designed such that there is very little change in pressure throughout the chamber. However, when using a workpiece as a chamber, one has no control over the shape of the workpiece. Therefore, the process must be designed to account for workpieces with high aspect ratios (length/diameter) in which there is a significant pressure drop from the gas inlet to the exit. This invention provides a method of coating such workpieces with good uniformity.

Methods of coating the interior surface of tubes have been described whereby the source material to be applied is inserted into the tube and then sputtered or arced off onto the tube. For example, U.S. Pat. No. 5,026,466 to Wesemeyer et al. describes a method of inserting a cathode into a tube and arcing the cathodic material onto the inside of the tube. U.S. Pat. No. 4,407,712 to Henshaw et al. describes a hollow cathode with a high evaporation temperature metal source inserted into a tube, with a cathode arc removing the source material from the hollow cathode and coating the inside surface of the tube. This type of arrangement has several drawbacks, including being limited to only large diameter tubes (due to having to insert the hollow cathode tube with associated heat shield and cooling tubes into the tube to be coated), the requirement of complicated arrangements for motion of anode and hollow cathode through the tube, and the generation of macro-particles by cathodic arc. U.S. Pat. No. 4,714,589 to Auwerda et al. describes coating the inside of a tube by plasma activated deposition of a gas mixture, but this method is limited to electrically insulative tubes and coatings, and involves a complicated system for moving a microwave source along the outside of the tube. A less complex approach is sought.

SUMMARY OF THE INVENTION

A method in accordance with the present invention allows uniform coating of internal surfaces of a pipe, tube or other workpiece by using the workpiece itself as a deposition chamber and using flow reversal of coating material within the workpiece. The method includes coupling at least a first opening of the pipe to a gas supply subsystem to function as an entrance and coupling at least a second opening of the pipe to a pumping subsystem to function as the exit. In a first coating cycle, gas is flowed through the pipe from the first opening (entrance) to the second opening (exit). Then, with the pipe remaining in place, the flow of gas through the workpiece is reversed to accomplish a second coating cycle. In some embodiments, the method and the system for implementing the method are used to provide reverse-cycle coating for a workpiece with more than two openings. On the other hand, the reverse-cycle coating method may be applied to workpieces with a single opening, if the cycling is via a device that is inserted into the workpiece.

This source gas can be activated to coat the surface of the workpiece by either thermal or plasma methods or a combination of the two. Using thermal methods, the workpiece can be placed in a heated oven or it can be wrapped in an insulating blanket with a heating coil without the need for a furnace. Thermal techniques can only be used for substrates that are not heat sensitive. For heat sensitive substrates, some amount of plasma activation must be used to lower the required activation temperature.

The invention can be used not only to form internal surface coatings but also to modify surface or sub-surface properties such as nitriding of steel or argon sputter cleaning of surfaces. This technique can be used not only for chemical vapor deposition processes (e.g., when a precursor gas or ionized gas reacts chemically at the surface) but also for techniques that would be classified as physical vapor deposition (i.e., the workpiece is bombarded by ions, that do not react chemically but physically, to form a coating or sub-surface modification), or combinations of these techniques. Because of its wider applicability and greater complexity, the invention is described utilizing plasma enhanced techniques, but the invention also applies to the simpler thermal methods of deposition or surface treatment.

This invention provides a method of coating such workpieces with good uniformity, by repeatedly and rapidly reversing the pressure drop from entrance to exit, at a minimum doubling the length of pipe that may be coated in comparison to prior art.

For the reverse-cycle coating process, the gas flow and the pumping speed preferably are adjusted such that the pressure provides a hollow cathode environment in the workpiece upon application of a voltage bias. This pressure is such that the electron mean free path is slightly less than the diameter of the tube, causing electrons to oscillate across the tube and resulting in multiple ionizing collisions and a more intense plasma. This provides an improvement relative to prior art PECVD approaches in which plasma is generated externally from a workpiece, resulting in a loss of ionization as gas flows through the tube, so that less film deposition occurs toward the exit from the workpiece. The hollow cathode effect, being dependent on pressure, the plasma density and consequently the film thickness and quality will vary along the length of the tube if the pressure drop across the tube becomes too large. In comparison, as a consequence of the flow reversal, the invention achieves a more uniformly ionized plasma along the length of the workpiece, thereby providing a more uniform deposition. Improvement in deposition uniformity is accomplished by controlling the pressure drop across the workpiece and implementing the reverse-cycle coating process to provide a uniform plasma.

The method allows coating of interior surfaces of pipes, tubes, valves, pumps or other workpieces with more complex geometries. While the openings may be referred to as "entrances" and "exits," these roles are reversed when the direction of flow is reversed. The flow cycling significantly reduces the possibility of an end-to-end decline in coating thickness as a consequence of a gradual reduction of the density of coating material in the plasma as the coating material is drawn from the plasma to the internal surface or surfaces of the workpiece. The improvement of end-to-end coating thickness is also due to the gas reservoirs providing fresh reactant gas at each workpiece opening, that can flow or diffuse into the pipe as the gas is consumed or depleted within the pipe during the coating process.

In accordance with one embodiment of a system for implementing the invention, the workpiece is connected to a biasing system such that the workpiece functions as a cathode. Initially, a first opening of the workpiece is coupled to a gas source to function as the entrance, while a second opening of the workpiece is coupled to a vacuum source to function as the exit. Then, the system is controlled to flow the coating material through the workpiece from the entrance to the exit, so as to implement a first coating cycle. With the workpiece remaining in situ, the flow of gas is reversed in direction, so as to implement a second coating cycle. The cycling may be repeated, if the particular application of the invention is one in which the further cycling improves coating uniformity.

In some embodiments, the biasing system is also cycled. A negative pulsed DC voltage is applied so as to have a duty cycle that is selected such that (1) when the voltage is "on," a negative voltage is applied to the workpiece such that positive source gas ions are attracted to the internal surfaces and react chemically to coat the internal surfaces of the workpiece, and (2) when the voltage is "off," the positive source gas ions are sufficiently replenished within the interior of the workpiece to provide uniformity in coating the internal surfaces. If the coating material is an insulator, the "off" condition of the duty cycle may include a reverse voltage that is sufficient to deplete surface charges resulting from the coating of the internal surfaces of the workpiece.

Where the workpiece includes at least two openings, anodes may be coupled to each opening, with the anodes being physically and electrically isolated from the workpiece by retractable seals. Also, a gas reservoir is coupled to each opening, such that the gas pressure at each opening can be controlled by means of the flow into the reservoir from the gas source and the flow out of the gas reservoir either into the pipe or to the pump. Thus, the pressure gradient across the pipe can be precisely controlled.

In another embodiment of the invention, a device is inserted into the workpiece and is used to implement the reverse-cycle coating method. The device includes at least one hole to enable gas flow to and from the device. In one cycle, the gas is flowed from the inserted device, through the conductive workpiece, and out an opening of the workpiece. This embodiment is particularly well suited for coating internal surfaces of a workpiece having a single opening. The flow of gas may be reversed, so that the flow is through the workpiece to the device. The device may include a tube that is adjustable in length and that includes a number of holes, with the number varying as the length is adjusted. This adjustability enables the device to be used to efficiently coat workpieces of various sizes.

DETAILED DESCRIPTION

Figure 1:
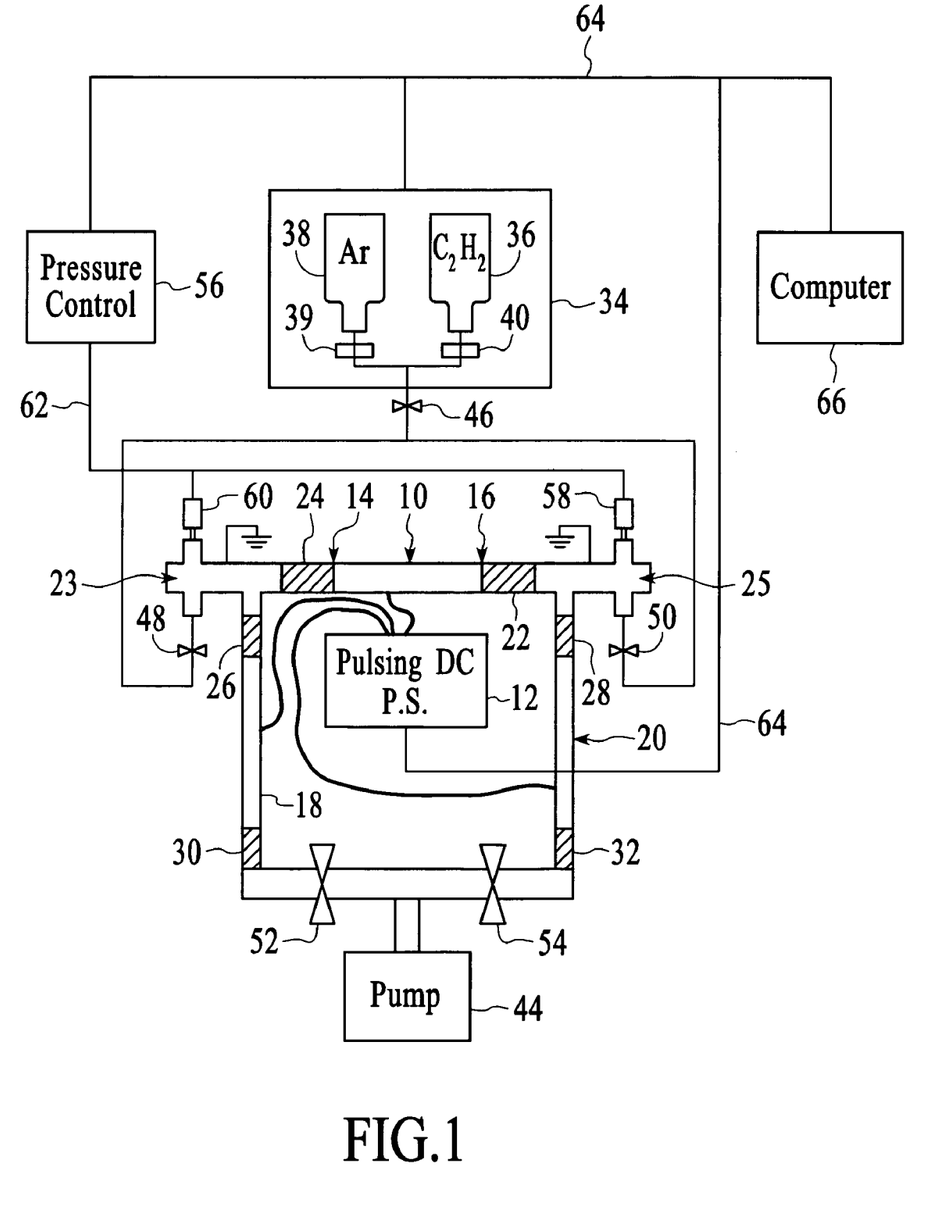
FIG. 1 is a functional view of a coating apparatus in accordance with one embodiment of the invention.

With reference to FIG. 1, a conductive pipe or "workpiece" 10 is connected to a pulsed DC power supply 12, which applies a pulsed negative bias. This negative bias is used to (a) create a plasma between a cathode and an anode, (b) draw an ionized reactive gas to the surfaces to be coated, (c) allow ion bombardment of the film to improve film properties such as density and stress levels, and (d) allow control of uniformity by adjusting the duty cycle so as to permit replenishment of a source gas and depletion of surface charges resulting from the coating process during the "off" portion of the cycle. Here, the workpiece 10 functions as a cathode while anodes 18 and 20 are connected to the positive side of the pulsed DC supply. Gas reservoirs 23 and 25 are coupled to each end of the workpiece. In this embodiment, they are electrically isolated from the workpiece and grounded. In other embodiments, they can be biased as a cathode or allowed to float with the anodes grounded. Pressure sensors 58 and 60 are located at each gas reservoir so that the pressure drop across the pipe can be monitored and controlled. The anodes are located near workpiece openings 14 and 16 and are physically and electrically isolated from the conductive workpiece and other functional subsystems by insulators 22, 24, 26, 28, 30 and 32. A gas supply subsystem 34 and pumping subsystem 44 are coupled to the gas reservoirs and the workpiece openings 14 and 16 via flow control valves 46, 48, 50, 52 and 54.

In FIG. 1, the workpiece 10 is shown as a single piece, but may be an assembly of tubes or pieces. The assembly preferably has all welding and assembly steps completed and should be leak tested prior to the coating process to be described below. The workpiece may be conductive piping that is connected to a system that includes the gas supply subsystem 34 and the pumping subsystem 44. A readily available non-toxic carbon containing gas, such as methane or acetylene, is provided by a first gas supply container 36. This gas is used to form a diamond-like carbon (DLC) coating on the inside of the workpiece. Argon (or other sputter gas) is provided from a second gas supply container 38 to allow plasma "pre-cleaning" of the pipe surface, and mixing of Ar and carbon-containing gas.

Flow control valves 46, 48 and 54 are "opened" (flow control valves 50 and 52 remain "closed") to allow pumping subsystem 44 to draw gas through workpiece 10 from opening 14 to opening 16 to implement a first coating cycle. Flow control valves 52 and 54 are adjustable to allow pressure adjustment for a given gas flow rate, also gas flow rate can be independently controlled by mass flow controllers 39 and 40. These valves are used to regulate the flow of gas and the pressure through the workpiece. Upon completion of the first coating cycle, flow control valves 48 and 54 are closed and flow control valves 50 and 52 are opened. This causes the source gas from gas supply subsystem 34 to flow through the workpiece from opening 16 to opening 14 to implement a second coating cycle.

A pressure controller 56 receives information from an optical probe 58 and a langmuir probe 60, which are placed such that the optical probe has a line-of-sight into the plasma and the langmuir probe contacts the plasma. The two probes sense plasma intensity and generate information indicative of the intensity level. This information is used by the controller to determine a proper setting for flow control valves 52 and 54. The setting should be such that the pressure inside the workpiece 10 establishes a condition in which the electron mean free path is slightly less than the inner diameter of the workpiece, causing electron oscillation and increased ionizing collisions by the "hollow cathode" effect. Thus, a more intense plasma is generated within the workpiece. Since the electron mean free path increases as the pressure decreases, it is necessary to decrease pressure as the pipe diameter increases. For example, a quarter inch (6.35 millimeter) diameter gasline will generate a hollow cathode plasma at a pressure of approximately 200 mTorr, while a four inch (101.6 millimeter) diameter pump exhaust duct would generate a plasma at a pressure of approximately 12 mTorr. These are intended to be approximate values to show the general trend of lower pressure with larger diameter, but the pressure range can vary significantly from these values and still maintain a hollow cathode plasma.

The pressure controller 56 is also used to monitor the pressure drop across the pipe and control and adjust it using pump throttle valves 52 and 54 or rapid response mass flow control valves 48 and 50. As mentioned earlier, it is desirable to prevent too large a drop in pressure and flow velocity for small diameter (3.8 cm) and long (61 cm) pipes to ensure a uniform high density hollow cathode effect plasma down the length of the pipe during the "on" condition of the pulsed DC supply. On the other hand, during the "off" cycle of a DC pulsed plasma burst, when it is desirable to rapidly refill the pipe with reactant gas, the pressure drop and flow velocity can be increased.

It is also desirable to change the duty cycle in different bursts. For example, a deposition burst is run at 100 kHz with a duty cycle of 55% "on," that is 4.5 microseconds off and 5.5 microseconds "on." A time period of 4.5 microseconds is not long enough to replenish the reactant gas throughout the length of a small diameter and long pipe, so this deposition burst should be run for a time period of approximately 10 microseconds. This is followed by a longer burst with a 100% "off" duty cycle to allow the gas to be replenished through the pipe. This "off" cycle should be increased as the diameter becomes smaller and the length longer, with approximately 2 seconds being applicable for a 3.8 cm diameter and 91 cm long pipe.

The degree of ionization or plasma intensity is important for the PIIID technique to be effective, since it is only the ionized gas that is accelerated across the plasma sheath into the workpiece 10. The hollow cathode effect provides a more intense plasma than is otherwise available in DC or RF plasmas. This increase in intensity is available without the complications of other means of generating intense plasmas, such as magnets or microwave plasma sources. The process also eliminates the need for separate heating of the workpiece 10. The optical and langmuir probes 58 and 60 are located at the anode end connections to monitor when the intense hollow cathode is properly generated.

Computer software control 66 is shown as being connected to the gas supply subsystem 34 and the pressure controller 56. In addition, the computer software control is able to generate and transmit control signals via an interface cable 64 to the DC pulsed power supply subsystem 12 for the purpose of governing operations.

When considering the flow rates and pressures required through a workpiece with a high aspect ratio (length/diameter), if the internal section is approximated to be a long circular tube with laminar flow, Poiseuille's equation can be used:

$$V = \frac{\pi r^4 \Delta P}{8 \eta l}$$

where V is the volumetric flow rate, r is the passageway radius, $\Delta P$ is the average pressure, l is the passageway length, $\eta$ is the viscosity. In the equation, r is raised to the fourth power and will cause a significant decrease in V. For example, a 3.8 cm diameter tube, the same length as a 7.6 cm diameter tube, will have 16× less flow, all other factors being equal. $\Delta P = VR$, where R is the resistance to flow, $$R = \frac{8 \eta l}{\pi r^4}.$$

The pressure gradient $\Delta P$ must increase as R becomes larger to maintain the same flow.

Increasing the length will have the same effect as decreasing the diameter, but to a lesser degree. For example, a 3.8 cm diameter tube that is 78.7 cm long with a pressure drop across the tube of 5.3 Pa (40 mTorr), flowing Argon with a viscosity of 0.02 cP, will have a flow rate of 176 cm$^3$/sec, while a 7.6 cm diameter tube of the same length pressure drop and gas will have a flow rate of 2,811 cm$^3$/sec. A pressure drop of 85 Pa (640 mTorr) would be required to achieve the same volumetric flow rate (2,811 cm$^3$/sec) in the 3.8 cm pipe. If we assume plug flow and calculate the residence time by dividing V by the cross sectional area, we obtain a residence time, $\tau$, for the 3.8 cm×78.7 cm pipe with $\Delta P$=5.3 Pa, of 5 sec, and $\tau$=1.3 sec for the same conditions for the 7.6 cm diameter pipe. To obtain a residence time of 1.3 sec for the smaller pipe $\Delta P$ must be increased to 21 Pa (159 mTorr), which would have a negative effect on plasma uniformity. These residence times give a rough indication of the time needed to refill the pipe with fresh reactant gas. For small diameter pipes, the plasma off time can be increased to refill the pipe or the pressure gradient can be increased to decrease the residence time, keeping in mind the negative effect too large a pressure gradient has on plasma uniformity. A combination of increased plasma "off" time and increased pressure gradient may also be implemented, being careful not to negatively affect the plasma uniformity with too large a pressure gradient.

The decrease in V and increase in pressure gradient with increasing aspect ratio (length/diameter) will have a significant effect on the uniformity of the deposition down the length of the workpiece. Since deposition rate is proportional to pressure and because the pressure becomes higher at the entrance of the workpiece with respect to the exit, the uniformity will become progressively worse with increasing length/diameter. Thus, it is desirable to have a low pressure drop $\Delta P$ across the pipe for good coating uniformity. On the other hand, if $\Delta P$ and thus the flow rate V become too low, the reactant gas will tend to deplete before it reaches the exit end of the pipe. This invention provides a method of coating such workpieces with good uniformity, by repeatedly and rapidly reversing the pressure drop from entrance to exit, at a minimum doubling the length of pipe that may be coated in comparison to prior art. Additionally, it provides a method of independently and precisely controlling the pressure drop across the pipe to maximize uniformity and replenish reactant gas, as it reacts with the pipe internal surface, from all openings of the pipe.

In a preferred embodiment, the valves 50 and 52, during the first coating cycle, are described as being closed. However, these valves, being adjustable, may be set in a partially open condition, but to a lesser degree than valves 48 and 54. The degree to which valves 50 and 52 are closed down is determined by the desired pressure across the pipe. For a minimal pressure across the pipe, the pumping speed on the exit side will be slightly greater than the pumping speed on the entrance side, requiring throttle valve 52 to be more closed down than throttle valve 54, for the same gas flow rate. Or the gas flow on the exit side can be slightly less than the gas flow on the entrance side, requiring mass flow control valve 50 to be more closed down than mass flow control valve 48, for the same pumping speed. Thus, precise control over the hollow cathode plasma is possible to ensure a uniform hollow cathode plasma across the entire workpiece 10. To implement the second coating cycle, the degree to which valves 48-54 are open or closed is also reversed.

In some applications of the invention, the first coating cycle and second coating cycle are repeated in order to provide a more uniform coating down the entire length of the internal surfaces of the workpiece. This "plasma cycling" technique is beneficial since the high pressure end of the workpiece 10 or flow inlet (opening 14 during first coating cycle, opening 16 during second coating cycle) has a higher deposition rate and thicker coating than the low pressure end or flow outlet. By reversing the direction of flow and pressure gradient through the workpiece, a uniform coating of the internal surfaces of the pipe is achieved.

Figure 2:
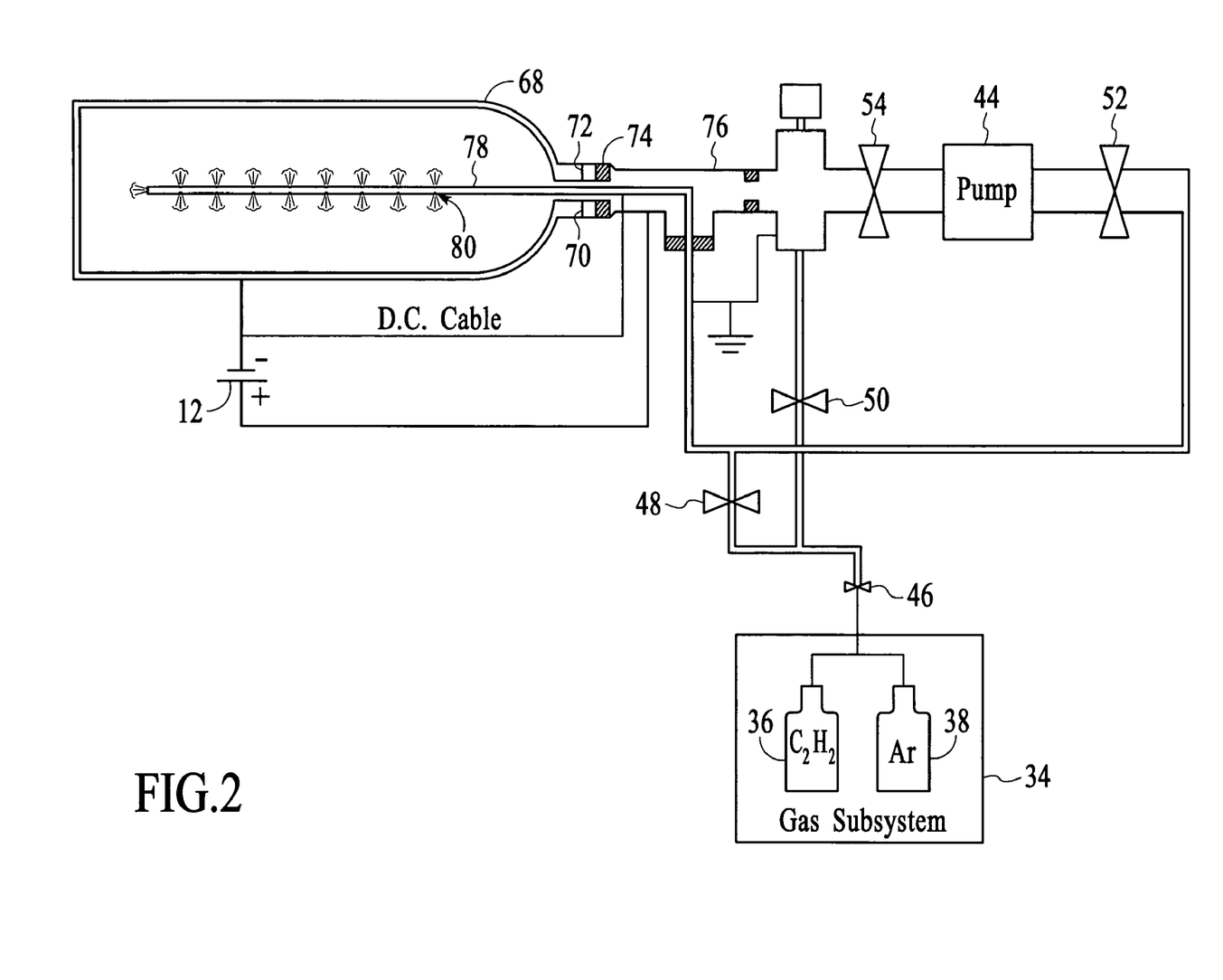
FIG. 2 is a functional view of a second embodiment of a coating apparatus in accordance with the invention.

Another embodiment of the invention is shown in FIG. 2, which depicts the method of coating the internal surfaces of a workpiece with a single opening. In this case, a cylinder 68 with the single opening 70 has a small section of sacrificial tubing 72 attached to it. The purpose of the sacrificial tubing is to ensure that plasma ignition takes place prior to the gas actually entering the workpiece. This ensures a full hollow cathode plasma density at the workpiece entrance. An anode 76 is attached to the sacrificial tubing, but is electrically isolated by an insulator 74. A gas injector 78 with a series of holes 80 along its length is inserted into the cylinder opening 70.

The DC pulsed power supply 12 is connected to the cylinder 68 (workpiece) and the gas injector 78 via a DC cable, as shown in FIG. 2. Both the cylinder and gas injector are biased negative with respect to anode 76. The method of connecting the DC cable to the gas injector is known in the art. The method of biasing the injector 78 as a cathode will allow increased pressure operation with a hollow cathode plasma, for large diameter cylinders, as some electrons will oscillate between the cylinder wall and the injector, effectively reducing the hollow cathode spacing from the diameter toward the radius of the cylinder. In another embodiment, for smaller diameter cylinders, the injector can be allowed to electrically float. That is, it is neither biased as a cathode or anode.

In another embodiment, the gas injector 78 is adjustable in length to adapt to workpieces of varying lengths and diameters. In this embodiment, the gas injector has a pattern of holes 80 along its length. As the gas injector is extended and retracted, the number of exposed holes along its length increases and decreases, respectively. However, the invention may also be implemented with a gas injector having a single hole.

As in FIG. 1, flow control valves 46-54 couple a gas supply subsystem 34 and pumping subsystem 44 to the cylinder 68 and gas injector 78. As previously described, the flow control valves are configured to implement both a first and second coating cycle. In this embodiment, the first cycle flows gas through the gas injector and is drawn down the interior of the cylinder and out the opening 70 to apply a coating. Then, the gas flow is reversed to trigger the second coating cycle.

Figures 3, 4:
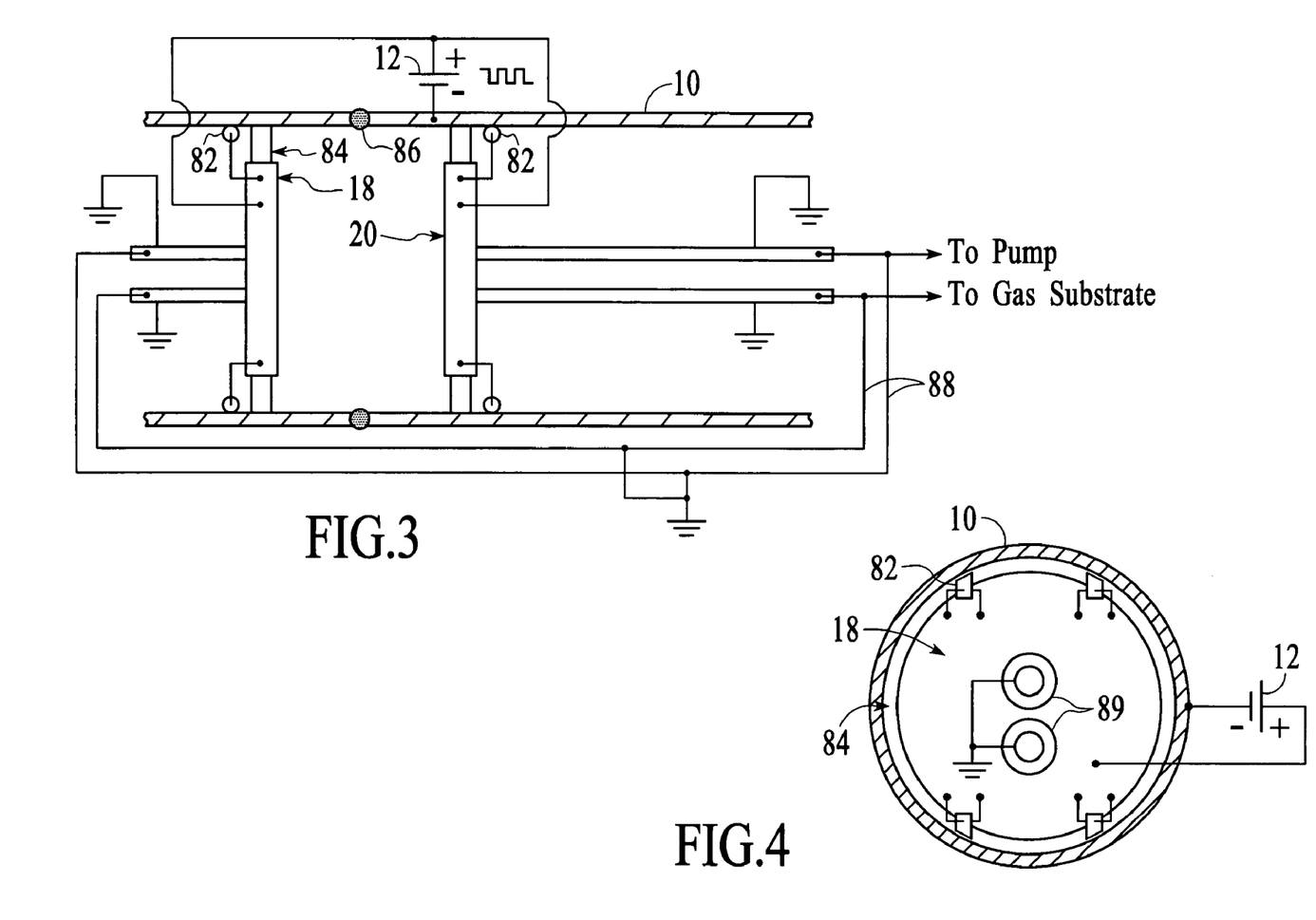
FIG. 3 is a functional view of a third embodiment of a coating apparatus in accordance with the invention.
FIG. 4 shows an end view of an anode in accordance with the third embodiment of the invention.

Another embodiment of the invention is shown in FIG. 3. Here, the method has been modified to coat a section of pipe in which the length-to-diameter aspect ratio is very large, for example greater than 50:1. In this instance, the "plasma cycling" method would still result in a coating with poor uniformity due to a loss in plasma density as ions are extracted to coat a pipe of very long length. That is, even with the benefits of "plasma cycling," the center region of a pipe or piping system having such an aspect ratio may have an undesirably low coating thickness when compared to the end regions. More typically, however, the embodiment of FIG. 3 is used in a situation where sections of pipe, having been coated using the "plasma cycling" method and having a uniform coating, are welded together to form very long lengths of pipe. The welds and areas surrounding the welds, in which the coating has been compromised by the welding process, require corrosion-resistant coating.

Referring to FIGS. 3 and 4, anodes 18 and 20 are mounted on insulated rollers 82. A retractable vacuum seal 84 surrounds the anode. The vacuum seal, when extended, physically and electrically isolates the anodes from the pipe. The anodes are inserted into each end of the pipe 10 (workpiece) and positioned at or near the weld 86 to be coated. Connected to the anodes, by known means, are flexible gas supply and pump lines 88. The gas supply and pump lines are electrically isolated from the anodes by insulators 89, shown in FIG. 4.

The vacuum seal 84 is extended and a DC pulsed power supply is used to apply a negative bias to the pipe 10 such that it functions as a cathode. Even though the entire pipe 10 is biased as a cathode, a plasma will only be generated within the interior of the pipe that resides between the anodes 18 and 20, because this is the only portion of the pipe interior that is at a low pressure and meets the spacing and pressure requirements for plasma ignition. Therefore, only the internal surfaces of the pipe section encompassing the low pressure area will be coated.

As previously described and shown in FIG. 1, flow control valves 46-54, gas supply subsystem 34 and pumping subsystem 44 are utilized to implement the first and second coating cycles. After the coating process is completed, the pipe section interior is brought to atmospheric pressure. The retractable vacuum seal 84 is withdrawn and the anodes 18 and 20 are moved, utilizing the flex lines 88, to the next weld or pipe section to be coated.

Figures 5, 6:
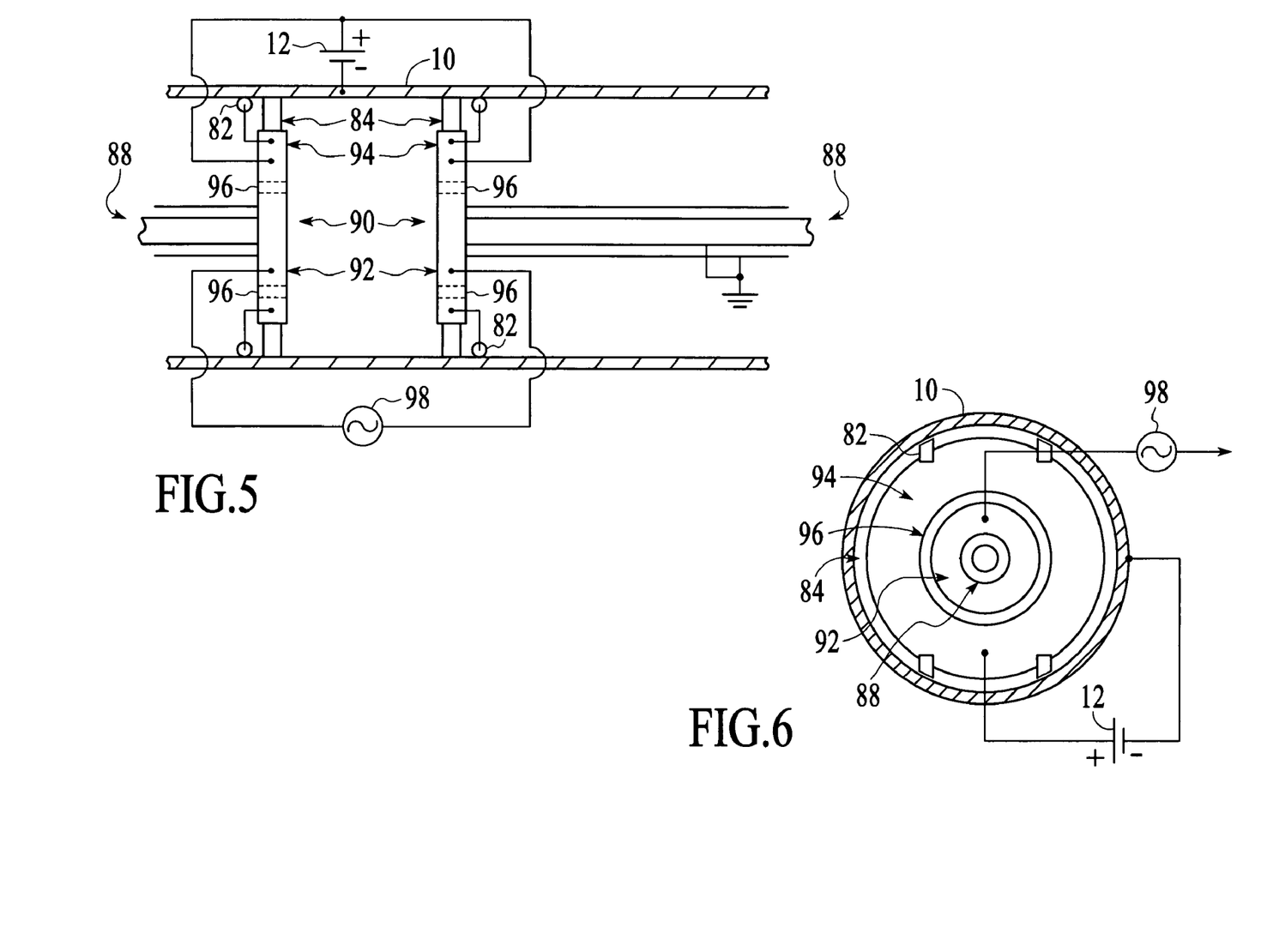
FIG. 5 is a functional view of a fourth embodiment of a coating apparatus in accordance with the invention.
FIG. 6 shows an end view of an anode structure in accordance with the fourth embodiment of the invention.

In another embodiment, shown in FIGS. 5 and 6, electrode structures 90 have been mounted on insulated rollers 82 and inserted into workpiece 10. The electrode structures are comprised of RF electrodes 92 and DC anodes 94. Flexible gas supply and vacuum supply lines 88 are also connected to the electrode structures. The RF-electrodes and DC anodes are isolated from each other by an annular insulator 96, which can be seen more clearly in FIG. 6. As in the previous embodiment, a retractable vacuum seal 84 surrounds the anode structure.

In this embodiment, an RF voltage supply 98 is connected to RF electrodes 92 as shown in FIG. 5. DC anodes 94 are connected to the pulsed DC power supply 12. This arrangement provides a capability for generating and controlling a plasma within the pipe 10 by varying the power, bias amplitude and frequency of the RF voltage supply. In addition, coating properties can be adjusted separately from any plasma adjustment by varying the power and bias of the DC pulsed power supply. First and second coating cycles and movement of the anode structures are implemented as described in previous embodiments.

Figure 7:
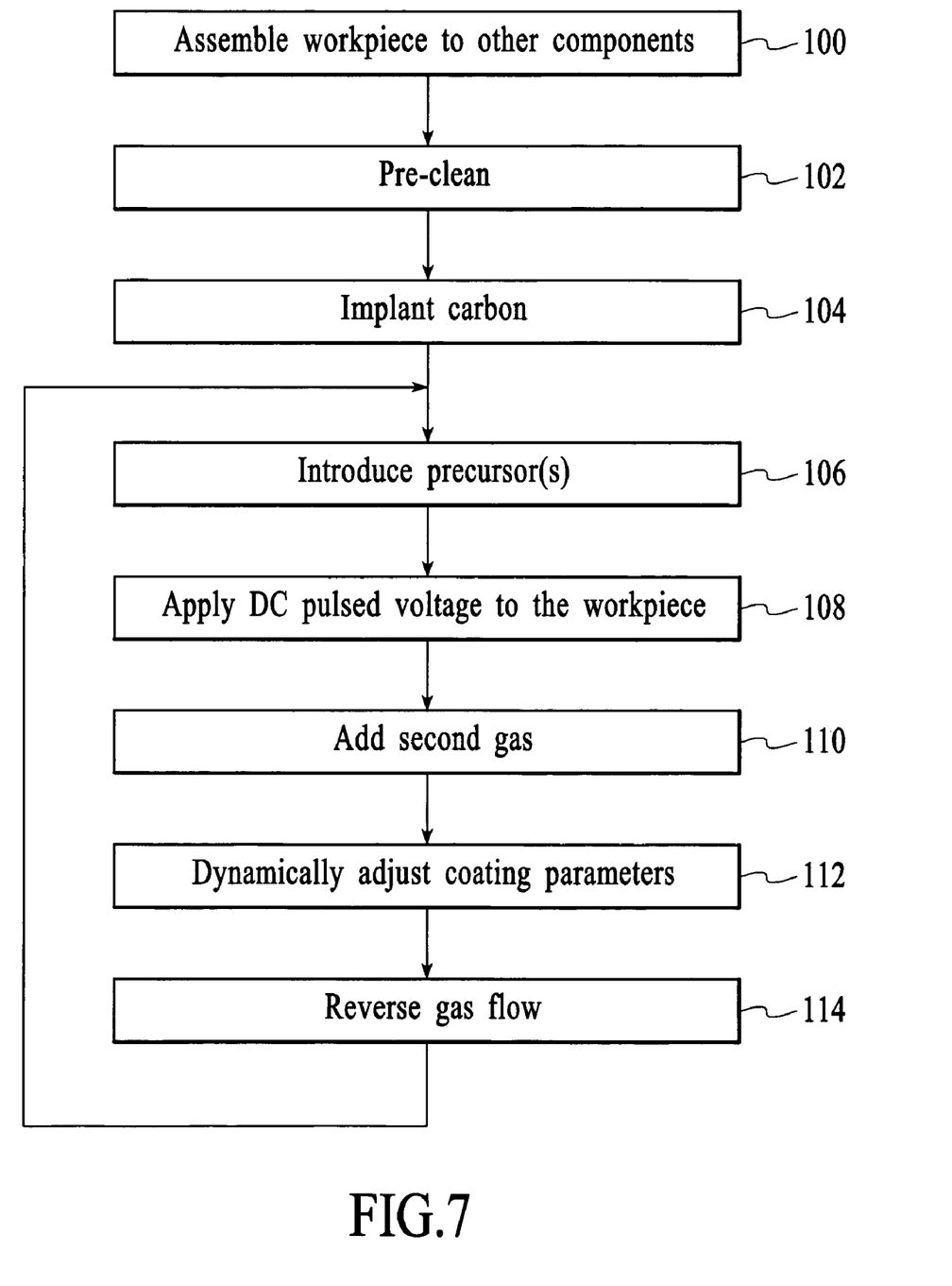
FIG. 7 shows a process flow of steps for implementing the invention.

One embodiment of a process flow in accordance with the invention will be described with reference to FIGS. 1 and 7. At step 100, the workpiece is assembled to other components of a tubing system, so that there is no requirement to heat the workpiece following the completion of the interior coating process. Thus, all welding steps involving the workpiece are completed to apply a coating material to the interior of the workpiece. As previously noted, while the workpiece is shown as being a unitary tube, the workpiece may be an assembly of tubes or parts.

At step 102, pre-cleaning occurs. The pre-cleaning may be an introduction of a sputtering gas, such as argon, from the first gas supply container 36. The pre-cleaning may be initiated after pump down to $1\times10^{-3}$ Torr or preferentially below $1\times10^{-4}$ Torr. Contaminants on the interior surface of the workpiece are sputtered off when a negative DC pulse is applied via the power supply 12.

An optional step 104 of implanting carbon may be used in some applications. Carbon implantation forms a subsurface carbon layer in the workpiece material, which may be stainless steel. This layer improves the adhesion to DLC and other materials. Carbon implantation is provided at a higher magnitude bias than experienced in the other steps of the coating process. A suitable bias is one which exceeds 5 kV. Care must be taken at this step for small diameter tubes, so that the size of the plasma sheath does not become larger than the radius of the workpiece.

Following the optional implantation step 104, at least one precursor is introduced into the workpiece 10 at step 106. Acceptable precursors include methane, acetylene or toluene. The DC pulsed voltage is reduced in this process step in order to provide thin film deposition, rather than implantation. The application of a DC pulsed voltage is represented by step 108 in FIG. 7. During the coating step, argon may be mixed with the carbon-containing precursors, as indicated at step 110.

In step 112, the coating parameters are dynamically adjusted during the coating process. The probes provide information that can be used by the computer software control 66 and the pressure controller 56 to maintain various parameters within their ranges of tolerance. Thus, the factors which determine pressure within the workpiece can be adjusted as needed or the magnitude and duty cycle of the pulsed bias may be adjusted, if necessary.

Upon completion of the first coating cycle, the gas flow is reversed at step 114. In this step, flow control valves 46-54 are reconfigured to implement the second coating cycle. Process flow steps 106-114 may be repeated to ensure that the internal surfaces of workpieces of different lengths and diameters are coated uniformly.

In principle, any metal, ceramic or DLC coating can be applied that has the desired properties of hardness and corrosion resistance (e.g., TiN, CrN, etc.). However, for coatings applied in the field, a non-toxic gas is employed. A DLC precursor such as methane, acetylene or toluene is used as the source gas in the preferred embodiment. DLC has been shown to provide a hard, corrosion-resistant, and low friction coating. Properties of this film can be tailored by adjusting the sp3 (diamond), sp2 (graphite) and sp1 (linear) bonding hybridization ratios in the film. Hydrogen content will also affect film properties. Typically, the highest sp3 ratio (most diamond-like) is obtained by methane, but this also produces a lower deposition rate compared to higher carbon molecules and also a higher compressive stress, limiting film thickness to approximately 5000 Å. The addition of certain dopants (e.g., silicon or silicon oxide) to the DLC matrix will improve thermal stability and can reduce compressive stress. An organic-based precursor, such as hexemethyldisiloxane ($C_6H_{18}Si_2O$) can be mixed with the hydrocarbon precursor(s) to introduce these dopants.

Film properties can thus be tailored by selection of the precursor gas or layered films can be deposited. For example, if it is necessary for a particular process (e.g., very rough welds) to have a thick deposited coating, the above process can be modified by deposition of a thin methane-based layer, followed by the use of a higher deposition rate, lower stress precursors such as toluene, or by higher energy ion bombardment to increase adhesion and reduce stress. The trade-offs between desired mechanical, electrical or optical film properties and deposition rate and stress for given precursors and bonding hybridizations can be optimized for a given process.

An advantage of the process is that the previously mentioned ion bombardment benefits of the PIIID method can be used to improve film adhesion and density. This is accomplished in the preferred embodiment by applying a negative pulsed DC bias to the workpiece with respect to the anode. Since the DLC coating is an insulator, short pulses are used (1-20 microsec) to prevent excessive building of positive charge on the coating. This charge is compensated when the plasma sheath collapses during the off cycle. The workpiece or coating surface is bombarded by energetic positive ions created by the hollow cathode within the workpiece. The energy of the ions can be controlled by the magnitude of the applied voltage and by the pressure (higher pressure causing more collisions, resulting in lower energy for a given voltage).

A further advantage is that a multi-step process can be used to tailor the film qualities deposited on the internal surface of the workpiece. The surface of the workpiece can also be pre-cleaned by the introduction of a sputtering gas such as Ar in the first step of the method, following pump down to $1 \times 10^{-3}$ Torr pressure or preferably $1 \times 10^{-4}$ Torr. Contaminants on the interior surface of the workpiece are sputtered off when the negative DC pulse is applied. A second step can then be performed using carbon implantation to form a subsurface carbon layer in the steel. This layer improves the adhesion of the DLC. This is done by increasing the magnitude of the bias to greater than 5 kV. Care must be taken at this step for small diameter tubes, so that the size of the plasma sheath does not become larger than the radius of the tube. The formula for the smallest radius of a cylinder for which the sheaths do not overlap is as follows:

$$d = \sqrt{\frac{4\varepsilon V}{en}}$$

where V is the magnitude of the voltage, and n is the plasma density.

Following this implantation step, DLC deposition steps are performed using the above-mentioned methane, acetylene or toluene precursors. The DC pulsed voltage is reduced in this process step to provide thin film deposition instead of implantation (e.g., 100 V-10 kV). Argon is also mixed with the carbon-containing precursors during these coating steps. Uniformity is also controlled by the duty cycle of the DC pulse, such that when the pulse is "off," the source gas is allowed to replenish and flow down the tube. One skilled in the art will recognize that uniformity is also controlled by the selections of the gas flow rate and the pumping speed.

What is claimed is:

1. A method of modifying an internal surface of a workpiece comprising:
    coupling at least one first opening of said workpiece to a gas source to function as an entrance and coupling at least one second opening of said workpiece to a vacuum source to function as an exit;
    connecting a biasing system so as to apply a negative pulsed DC voltage to said workpiece, including selecting a duty cycle such that:
        (a) when said voltage is in an "on" condition, a negative voltage is applied to said conductive workpiece such that positive source gas ions within said gas generated in an interior of said conductive workpiece are attracted to said internal surfaces and react chemically to modify said internal surfaces; and
        (b) when said voltage is in an "off" condition, said positive source gas ions are sufficiently replenished within said interior to provide uniformity in coating said internal surfaces;
    flowing gas having a surface modifying material through said workpiece from said at least one first opening to said at least one second opening to implement a first coating cycle;
    with said workpiece remaining in situ, reversing said flow of gas through said workpiece to implement a second coating cycle;
    repeating said first and said second coating cycles to provide a uniform coating on said internal surfaces of said conductive workpiece, said repeating being adjustable for different said conductive workpieces of varying diameters and lengths;
    decreasing a pressure gradient in said interior when said voltage is in said "on" condition, thereby decreasing said flow through said workpiece; and
    increasing said pressure gradient in said interior when said voltage is in said "off" condition, thereby increasing said flow through said workpiece.

2. The method of claim 1 wherein said coupling of said gas source includes providing a gas reservoir having (1) an inlet coupled to said gas source, (2) an outlet coupled to said vacuum source, and (3) a workpiece connection opening connected to said workpiece, said coupling further including providing a capability for controlling pressure at said inlet and said outlet of said gas reservoir.

3. The method of claim 2 further comprising duplicating said providing said gas reservoir at each said first opening and each said second opening of said workpiece.

4. The method of claim 1 wherein coupling said vacuum source includes pumping an interior of said workpiece to a low pressure prior to introducing said gas so as to create a stable pressure within said interior, said workpiece being electrically conductive.

5. The method of claim 1 wherein connecting said biasing system includes applying said pulsed DC voltage as a voltage bias between said conductive workpiece acting as one electrode and counter-electrodes at said first and second openings, said first and second openings being electrically isolated from said workpiece, such that a plasma is generated within said interior of said conductive workpiece.

6. The method of claim 5 further comprising regulating said gas source and said vacuum source such that the pressure within said interior remains related to an interior diameter of said conductive workpiece so as to maintain a condition in which said plasma intensity within said interior is adjustable via variations of said biasing system, wherein said condition establishes a hollow cathode effect.

7. The method of claim 1 wherein said repeating of said first and said second coating cycles is computer controlled.

8. The method of claim 1 wherein said attracting of said source gas ions to said internal surfaces reacts physically to modify said internal surfaces.

9. The method of claim 1 wherein said "off" condition of said duty cycle includes a reverse voltage sufficient to deplete surface charges resulting from said coating of said internal surfaces, wherein said coating material is an insulator.

10. The method of claim 1 wherein coupling said gas source includes providing a hydrocarbon gas having said coating material of diamond-like carbon.

11. The method of claim 1 wherein said modifying of said internal surfaces is formed from said gas by thermal activation via heating of said workpiece.

12. A method for coating the internal surfaces of a conductive workpiece having at least one opening comprising:
    connecting a biasing system such that said conductive workpiece functions as a hollow cathode;
    coupling a vacuum source to said at least one opening of said conductive workpiece to function as an exhaust;
    inserting a device into said at least one opening of said conductive workpiece, said device having a plurality of holes to enable gas flow to and from said device, said holes being arranged along an exterior of said device in a lengthwise direction of said conductive workpiece;

flowing a gas through said conductive workpiece from said holes of said device to said at least one opening of said conductive workpiece to implement a first coating cycle, including generating a plasma within an interior of said conductive workpiece, said plasma having intensity that is adjustable by varying said biasing system; and with said conductive workpiece remaining in situ, reversing said flowing gas through said conductive workpiece from said at least one opening of said conductive workpiece to said holes of said device to implement a second coating cycle; and repeating said first and said second coating cycles to provide a uniform coating on said internal surfaces of said conductive workpiece, said repeating being adjustable for different said conductive workpieces of varying diameters and lengths.

13. The method of claim 12 further comprising repeating said first and second coating cycles to provide a uniform coating on said internal surfaces of said conductive workpiece, said repeating being adjustable for different said conductive workpieces of varying diameters and lengths.

14. The method of claim 12 wherein inserting said device includes providing a tube that is adjustable in length, said tube having said plurality of said holes along said adjustable length.

15. The method of claim 14 further comprising varying said adjustable length to provide a uniform surface coating for conductive workpieces of different diameters and lengths, said varying of said adjustable length further comprising varying the number of holes along said adjustable length.

16. The method of claim 12 wherein said device is inserted into a conductive workpiece with only one opening.

17. The method of claim 12 further comprising connecting said inserted device to said biasing system to function as a cathode.

18. A method of modifying an internal surface of a workpiece comprising:
- coupling at least one first opening of said workpiece to a gas source to function as an entrance and coupling at least one second opening of said workpiece to a vacuum source to function as an exit;
- connecting a biasing system so as to apply a negative pulsed DC voltage to said workpiece, including selecting a duty cycle such that:
  - (a) when said voltage is in an "on" condition, a negative voltage is applied to said conductive workpiece such that positive source gas ions within said gas generated in an interior of said conductive workpiece are attracted to said internal surfaces and react chemically to modify said internal surfaces; and
  - (b) when said voltage is in an "off" condition, said positive source gas ions are sufficiently replenished within said interior to provide uniformity in coating said internal surfaces;
- flowing gas having a surface modifying material through said workpiece from said at least one first opening to said at least one second opening to implement a first coating cycle;
- with said workpiece remaining in situ, reversing said flow of gas through said workpiece to implement a second coating cycle;
- repeating said first and said second coating cycles to provide a uniform coating on said internal surfaces of said conductive workpiece, said repeating being adjustable for different said conductive workpieces of varying diameters and lengths;
- wherein selecting said duty cycle for said "on" condition of said voltage and selecting a pressure drop across said interior of said workpiece include basing selections on an aspect ratio of interior length to interior diameter of said workpiece.

19. The method of claim 18 wherein said "off" condition of said duty cycle includes a reverse voltage sufficient to deplete surface charges resulting from said coating of said internal surfaces, wherein said coating material is an insulator.

20. The method of claim 18 wherein said repeating of said first and said second coating cycles is computer controlled.

* * * * *